United States Patent [19]

Goodman et al.

[11] Patent Number: 4,685,775
[45] Date of Patent: Aug. 11, 1987

[54] LIGHT BEAM POSITIONING APPARATUS

[75] Inventors: Frederick A. Goodman, Brookline; Antonios E. Prentakis, Cambridge, both of Mass.

[73] Assignee: Teradyne, Inc., Boston, Mass.

[21] Appl. No.: 798,584

[22] Filed: Nov. 15, 1985

[51] Int. Cl.⁴ ............................................. G02B 26/08
[52] U.S. Cl. .................................................. 350/486
[58] Field of Search ................... 350/6.2, 6.3, 6.4, 6.5, 350/6.6, 484, 486, 415

[56] References Cited

U.S. PATENT DOCUMENTS 3,838,912 10/1974 Arimoto et al. ..................... 350/484
4,248,495 2/1981 Minoura ............................... 350/6.6

OTHER PUBLICATIONS

Peisue, "Precision Post-Objective, Two-Axis, Galvanometer Scanning", *SPIE*, vol. 390, (1983).
Brochure, M118-M, Memory Repair System, Teradyne.
Descriptive Sheet, M118 Optical System, Teradyne.

Primary Examiner—John K. Corbin
Assistant Examiner—Vincent J. Lemmo

[57] ABSTRACT

Pivoting a beam of light in one axis about a remote point by providing means for laterally translating the beam and a pivotal reflector and providing control means responsive to the pivotal position of the reflector to cause the means for laterally translating to translate the beam the amount necessary to cause the light beam from the reflector to be reflected to the remote point.

9 Claims, 3 Drawing Figures

LIGHT BEAM POSITIONING APPARATUS

FIELD OF THE INVENTION

The invention relates to apparatus for pivoting a beam of light in one axis about a remote point, and in particular to pivoting a laser beam about a single point in two axes through a telecentric lens to scan a semiconductor wafer.

BACKGROUND OF THE INVENTION

Pivotal mirrors have often been used to reflect light beams from stationary sources to targets of interest. For example, Peisue, "Precision, post-objective, two-axis, galvanometer scanning", *SPIE* Vol. 390 (1983) describes using galvanometers to quickly and accurately pivot one mirror about one axis and another mirror about another axis to move a laser beam in two axes and direct it to any desired position on a target. Teradyne, Inc.'s prior art M118-M Memory Repair System employs two galvanometers to pivot two mirrors that direct a laser beam to a telecentric lens that is positioned in front of a semiconductor wafer; the beam passes at varying angles to the axis of the lens through the back pupil of the lens (positioned between the two mirrors) and is directed to the target position on the wafer generally parallel to the lens axis.

SUMMARY OF THE INVENTION

We have discovered that a beam of light can be advantageously pivoted in one axis about a remote point by providing means for laterally translating the beam and a pivotal reflector and providing control means responsive to the pivotal position of the reflector to cause the means for laterally translating to translate the beam the amount necessary to cause the light beam from the reflector to be reflected to the remote point.

In preferred embodiments a second pivotal reflector is pivotally mounted about an axis that is perpendicular to the axis of the first pivotal reflector, is parallel to the initial input beam and passes through the remote point so that the light beam is pivoted in two axes about the remote point; a pivotal flat refracting element is used to translate the beam, and a beam expanding telescope increases the amount of translation; and a telecentric lens is used to scan a semiconductor wafer, the remote point being the center of the back pupil of the telecentric scanning lens. An advantage of the invention is improved ability of the telecentric scanning lens to focus laser energy evenly across its entire scan field.

Other features and advantages of the invention will be apparent from the following description of the preferred embodiment thereof, and from the claims.

DESCRIPTION OF THE PREFERRED EMBODIMENT

STRUCTURE

Figure 1:
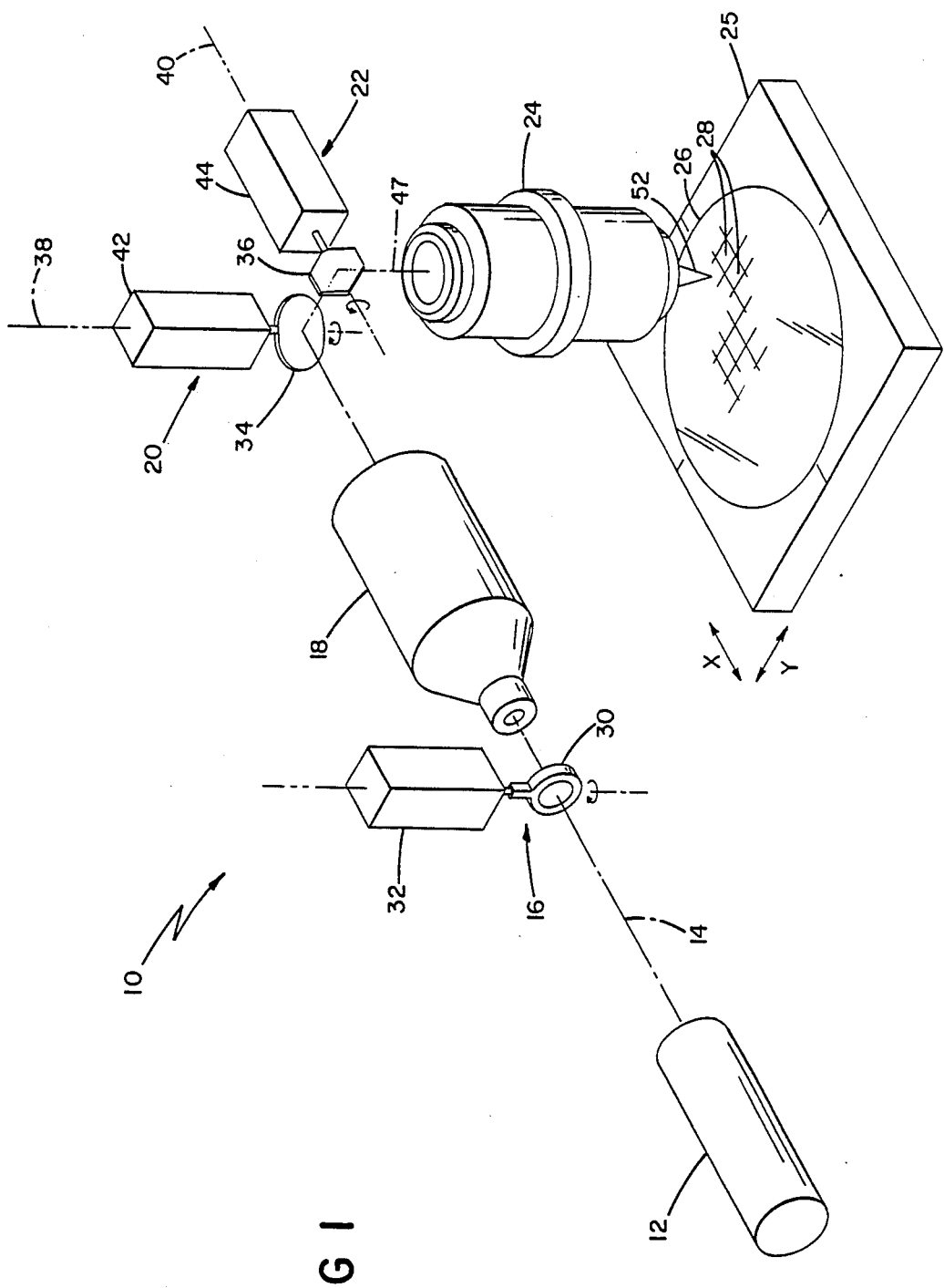
FIG. 1 is a diagrammatic perspective view of laser beam positioning apparatus according to the invention.

Referring to FIG. 1, there is shown laser beam positioning apparatus 10 including neodymium YAG laser source 12 providing 1.06 micron beam 14, beam translator 16, beam expanding telescope 18, X-axis pivotal reflector 20, Y-axis pivotal reflector 22, telecentric scanning lens 24, and movable wafer support 25 carrying semiconductor wafer 26 bearing memory circuits 28. One characteristic of telecentric scanning lens 24 is that the chief ray of the imaging beam is perpendicular to the focal plane throughout the length of the scan.

Beam translator 16 includes optically flat refracting element 30 (a flat piece of glass) pivotally mounted on galvanometer 32. Refracting element 30 is inclined in its mount with respect to the vertical perpendicular axis to beam 14, for the purpose mentioned below. Pivotal reflectors 20, 22 include mirrors 34, 36 mounted for pivoting about axes 38, 40 on galvanometers 42, 44 respectively. Galvanometers 32, 42, 44 (available from General Scanning, Inc., and described in Peisue mentioned above) quickly move the mirrors to the desired position, owing to low masses involved, and accurately achieve the desired angular position, owing to built-in analog feedback loops.

Figure 2:
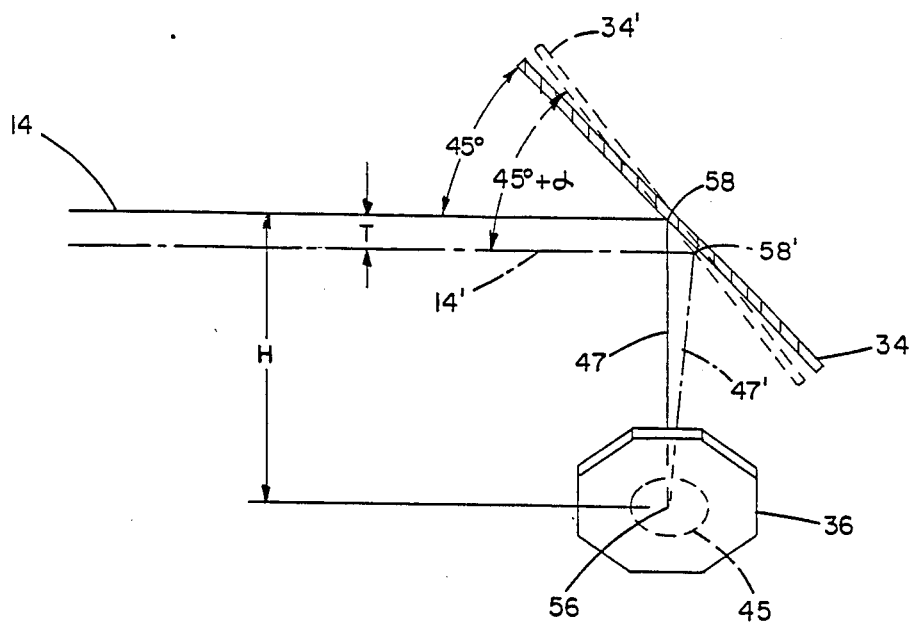
FIG. 2 is a diagram showing a pivotal reflector of the FIG. 1 apparatus and said beam in different positions.

Referring to FIG. 2, it is seen that center point 56 of back pupil 45 for telecentric lens 24 is located on mirror 36, and that mirror 34 (shown horizontally sectioned) and laser beam 14 are automatically adjusted so that reflected beam 47 is directed to center point 56, regardless of the pivotal position of mirror 34, for the reasons mentioned below.

Figure 3:
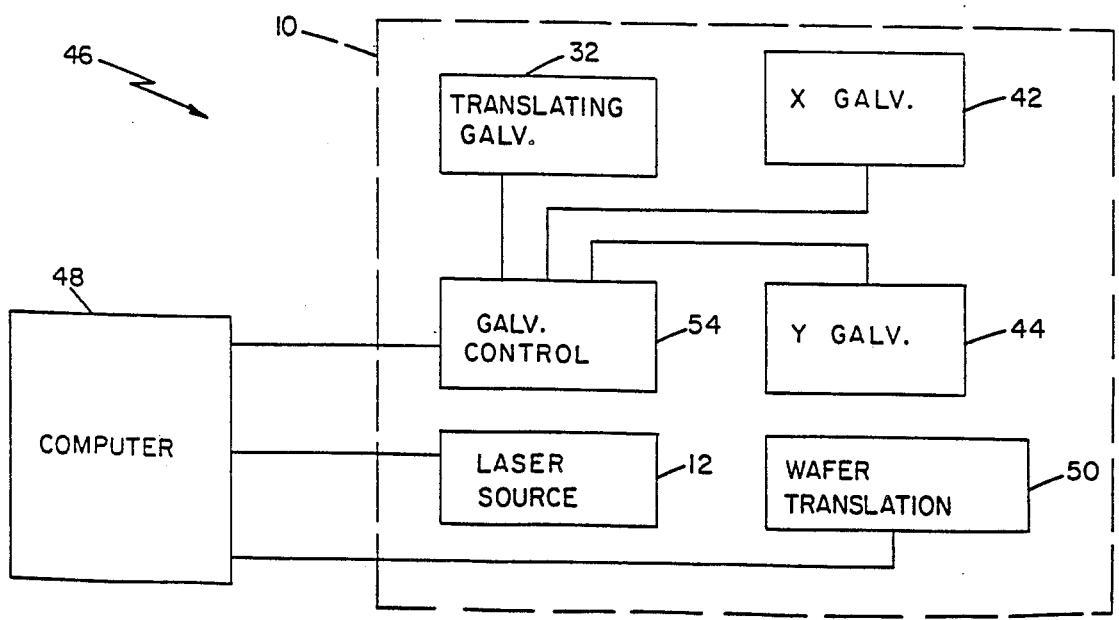
FIG. 3 is a diagram of a memory repair system incorporating the laser beam positioning apparatus of FIG. 1.

Referring to the simplified block diagram of FIG. 3, it is seen that memory repair system 46 incorporating laser beam positioning apparatus 10 is controlled by external computer 48 and includes wafer translation mechanism 50, to make large movements of wafer 26 so that individual memory circuits 28 are moved into position for scanning by focused laser beam 52 (FIG. 1). Galvanometer control circuit 54 converts digital control signals into analog position signals for the galvanometers.

OPERATION

In operation, a wafer 26 containing memory circuits 28 to be repaired by exposure to focused laser beam 52 is mounted on support 25. The positions of the particular polysilicon links to be exposed to the laser beam can either be determined prior to mounting on support 25, and fed into computer 48, or they can be determined by testing circuits 28 after mounting on support 25 using testing probes and circuits (not shown), as in the Teradyne, Inc. M118M repair system. Wafer translation mechanism 50 moves individual circuits 28 on wafer support 25 into alignment with telecentric scanning lens 24, and galvanometers 32, 42, 44 are used to quickly and accurately direct focused beam 52 to the polysilicon links to be severed on the particular memory circuit 28 being repaired.

Galvanometer 42 pivots mirror 34 so that focused beam 52 moves in the X direction on wafer 26, and galvanometer 44 pivots mirror 36 so that focused beam 52 moves in the Y direction, all under control of computer 48. Depending on the pivotal position of mirror 34, galvanometer 32 adjusts refracting element 30 to laterally translate beam 14 the amount necessary so that it is reflected from mirror 34 to the center point 56 of pupil 45. (Put another way, reflected beam 47 is pivoted in one axis about center point 56.) As shown in FIG. 2, when mirror 34 is at the pivotal position of 45° to beam 14, beam 14 originally reflects off mirror 34 at location 58 and is directed (as reflected beam 47) to center point 56. When mirror 34 is pivoted by angle a to the position shown in phantom (34'), beam 14 is translated to the position designated 14', and is reflected off mirror 34 at location 58' as reflected beam 47' to center point 56. If beam 14 were not so translated, it would be directed to the left of point 56, owing to the changed angle of mirror 34. The amount of translation T of beam 14 necessary to direct reflected beam 47 to center point 56 is given by the following formula:

$$T = H \text{ Sine } 2 a$$

where H is the distance from point 58 (the point of reflection of beam 14 at mirror 34 when mirror 34 is at a 45° angle) to center point 56, and a is the angle from 45° that mirror 34 has been pivoted.

Beam expander 18 expands beam 14 from its initial ⅛" diameter to a 1' diameter. The increase in beam diameter is significant in that the spot size of focused beam 52 is inversely proportional to the diameter of the beam entering telecentric lens 24, and it is desirable to obtain a small spot size. Beam expander 18 also magnifies the translation provided by pivoting refracting element 30. This magnification is important, because the translation provided by refractory element 30 alone is generally too small for practical values of glass thickness and rotation angle. The actual relationship between rotation of refracting element 30 and mirror 34 is empirically determined and stored in computer 48.

By pivoting beam 47 in two axes through center point 56, pupil 45 need only be as big as the beam diameter. (In the arrangement in Teradyne, Inc.'s M118M system with the pupil located between the two mirrors, the pupil has to be larger than the beam diameter, because the beam travels across the pupil as the first mirror pivots.) This ability to make the beam as large as the pupil permits a larger beam diameter (and accordingly a smaller spot size for focused beam 52) for a given lens diameter, and, everything else being equal, it is desirable to keep the lens diameter small, as telecentric lenses become increasingly complicated and expensive with increases in diameter.

While the two pivotal reflectors 20, 22 and beam translator 16 could conceivably be replaced by a single reflector provided with a mechanism for pivoting about two axes, such a system would necessarily be complicated and would not have the quick and accurate positioning provided by the galvanometers.

A further advantage of the invention is related to sensing of the laser beam reflected back from the surface of wafer 26, e.g., when scanning a calibration grid to obtain correction values to be incorporated into the control signals for the galvanometers. When the pupil is located between the two mirrors, and the beam travels across it, the focused beam does not hit the wafer perpendicular to it, resulting in loss of light reflected back through the lens to the detection components (a photodiode receiving light from a beam splitter located between beam expander 18 and reflector 34, both of which are not shown). By pivoting the beam about center point 56 in the system described herein, focused beam 52 is perpendicular to wafer 26. Because refracting element 30 is at a slight incline with respect to the vertical perpendicular to laser beam 14, the small reflections from it of light reflected back from the wafer are not directed to the photodiode in any angular position of element 30.

The beam translator angle of refracting element 30 can be finely adjusted by placing a mirror at the focal plane of the telecentric scanning lens (i.e., at wafer support 25). If both beam translator galvanometer 32 and X-axis galvanometer 42 are pivoting correctly, there is no relative translation between the incoming and reflected beams. The beam translator angle is adjusted to keep the reflected energy constant at all corresponding X-axis galvanometer 42 positions.

OTHER EMBODIMENTS

Other embodiments of the invention are within the scope of the following claims.

For example, the capability of pivoting a laser beam in two axes prior to a focusing lens is desirable in other applications, such as thick film resistor trimming, phototypesetting and noncontact reprographic systems.

What is claimed is:

1. Apparatus for pivoting a light beam about an axis to a remote point, said apparatus comprising
    translation means for laterally translating said light beam,
    a first reflector positioned to receive said light beam from said translation means and pivotally mounted about a first axis so as to reflect said light beam at varying angles from the path of said beam from said translation means, depending on the pivotal position of said first reflector, and
    control means responsive to said pivotal position of said first reflector for automatically causing said translation means to laterally translate said path of said light beam the amount necessary to cause said light beam from said first reflector to be reflected to a fixed remote point, regardless of said pivotal position of said first reflector.

2. The apparatus of claim 1, further comprising a first galvanometer attached to pivot said first reflector about said first axis.

3. The apparatus of claim 1 wherein said translation means comprises a pivotal, optically flat refracting element.

4. The apparatus of claim 3 further comprising a beam expanding telescope positioned along said path to amplify said lateral translation of said beam.

5. The apparatus of claim 1 further comprising a second pivotal reflector mounted for pivoting about a second axis passing through said remote point and reflecting said light beam at said remote point, whereby said light beam is pivoted in two axes through said remote point.

6. The apparatus of claim 2 further comprising a telecentric scanning lens positioned so that its back pupil is located at said remote point.

7. The apparatus of claim 6, further comprising a first galvanometer attached to pivot said first reflector about said first axis, and a second galvanometer attached to pivot said second reflector about said second axis.

8. The apparatus of claim 6 wherein said translation means comprises a pivotal, optically flat refracting element, and further comprising a beam expanding telescope positioned along said path to amplify said lateral translation of said beam.

9. The apparatus of claim 8 further comprising a first glavanometer attached to pivot said first reflector about said first axis, a second galvanometer attached to pivot said second reflector about said second axis, and a third galvanometer attached to pivot said optically flat refracting element.

* * * * *